United States Patent [19]

Papaliolios

[11] Patent Number: 5,237,533
[45] Date of Patent: Aug. 17, 1993

[54] HIGH SPEED SWITCHED SENSE AMPLIFIER

[75] Inventor: Andreas G. Papaliolios, Sunnyvale, Calif.

[73] Assignee: National Semiconductor Corporation, Santa Clara, Calif.

[21] Appl. No.: 811,084

[22] Filed: Dec. 20, 1991

[51] Int. Cl.$^5$ .............................................. G11C 7/02
[52] U.S. Cl. .............................. 365/207; 365/189.01; 365/189.09; 365/208; 307/530
[58] Field of Search .............. 365/207, 189.07, 189.09, 365/189.01, 230.01, 208, 210; 307/530, 362, 355, 354, 279, 578

[56] References Cited

U.S. PATENT DOCUMENTS

| | | | |
|---|---|---|---|
| 3,599,185 | 8/1971 | Bartlett | 340/173.2 |
| 4,075,509 | 2/1978 | Redfern | 307/251 |
| 4,191,900 | 3/1980 | Redfern et al. | 307/355 |
| 4,604,533 | 8/1986 | Miyamoto et al. | 365/208 X |
| 4,669,063 | 5/1987 | Kirsch | 365/207 X |
| 4,670,675 | 6/1987 | Donoghue | 307/530 |
| 4,751,681 | 6/1988 | Hashimoto | 365/207 |
| 4,809,225 | 2/1989 | Dimmler et al. | 365/145 |
| 4,853,893 | 8/1989 | Eaton, Jr. et al. | 365/145 |
| 4,873,664 | 10/1989 | Eaton, Jr. | 365/145 |
| 4,888,733 | 12/1989 | Mobley | 365/145 |
| 5,029,138 | 7/1991 | Iwashita | 365/208 |
| 5,038,323 | 8/1991 | Schwee | 365/145 |

Primary Examiner—Eugene R. LaRoche
Assistant Examiner—Son Dinh
Attorney, Agent, or Firm—Richards, Medlock, & Andrews

[57] ABSTRACT

A sense amplifier that is calibrated prior to each memory read operation to reduce the effects of offsets in a differential input stage. A differential amplifier output signal is connected to a switched inverter by a coupling capacitor. During an equalization time period, the inverter is short circuited between its input and output and is biased to a high gain, trip point. During such time period, the differential amplifier has a bit line input and a reference voltage input, both precharged to a predetermined voltage. The output of the differential amplifier is coupled to a low impedance amplifier. The low impedance amplifier provides an output midway between the supply voltage and ground. The coupling capacitor is charged during the equalization period, but when the bit line voltage and reference voltage are applied to the differential amplifier, the coupling capacitor is charged or discharged, depending upon the state of the memory readout signal. The change in the charge on the coupling capacitor moves the switched inverter from its trip point to an output logic state, also depending upon the memory readout signal. The sense amplifier is thus automatically calibrated, and provides a high speed sensing of memory signals.

17 Claims, 2 Drawing Sheets

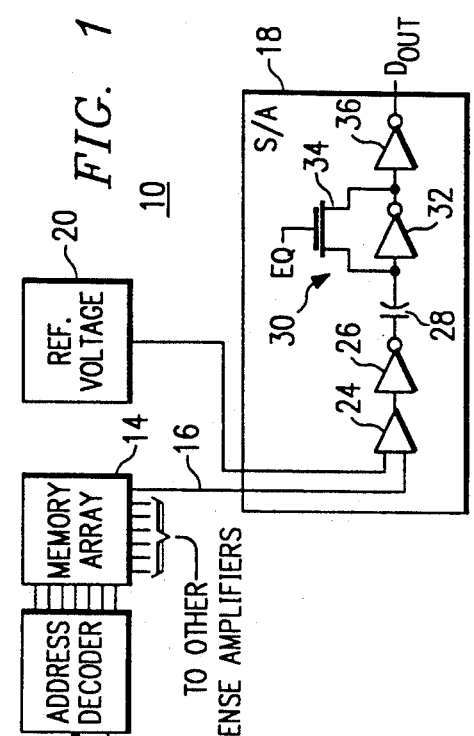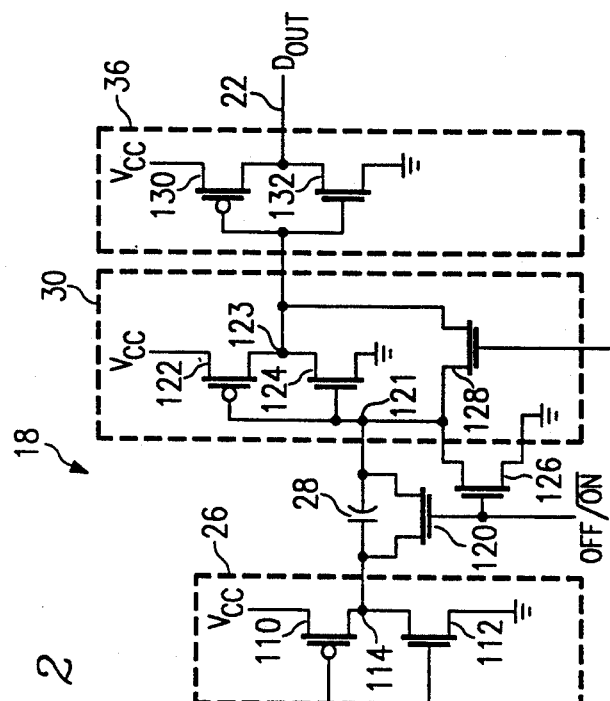

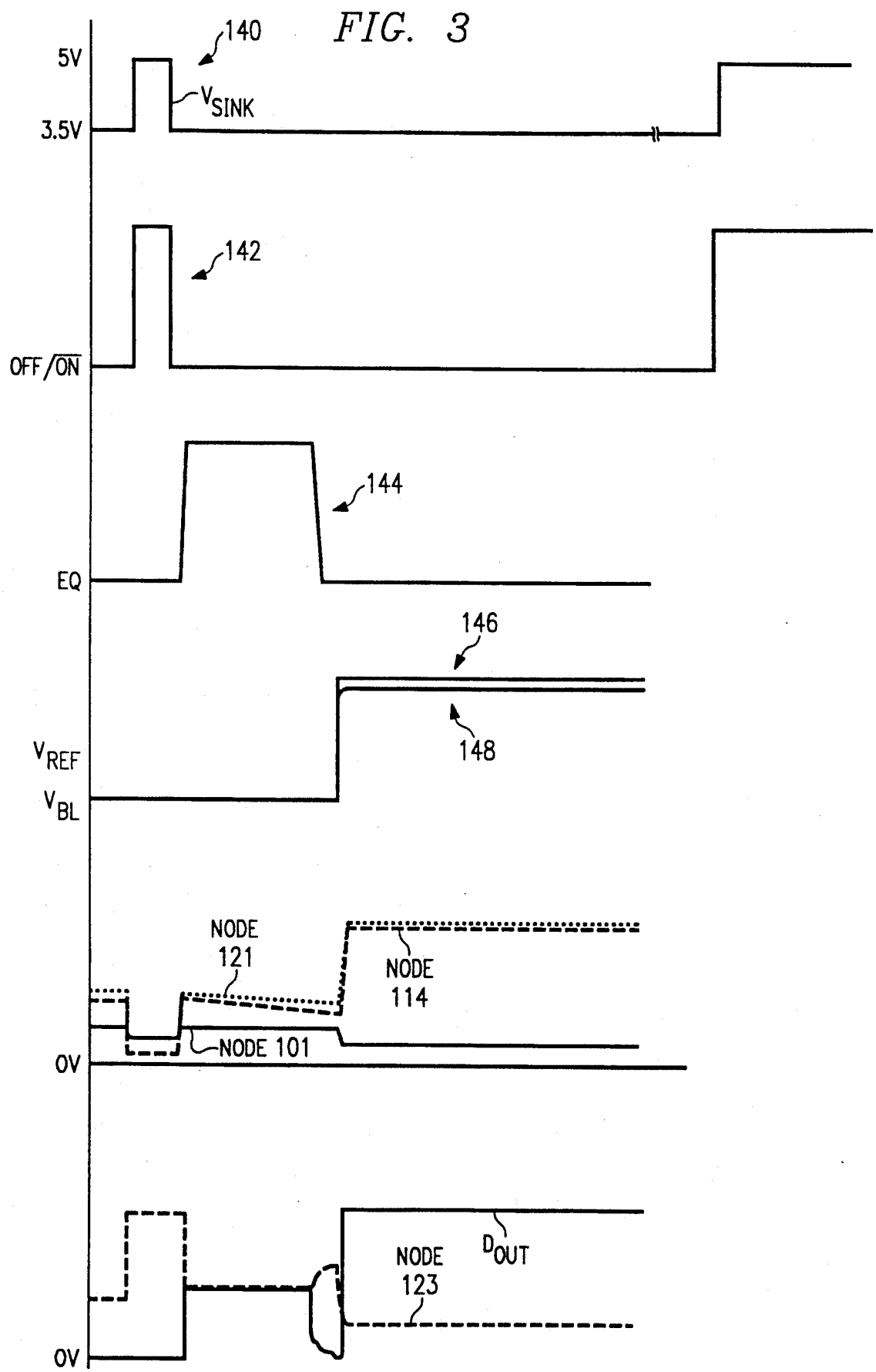

HIGH SPEED SWITCHED SENSE AMPLIFIER

RELATED APPLICATION

U.S. patent application entitled "Dynamic Adjusting Reference Voltage for Ferroelectric Circuits" filed Aug. 15, 1991, and Ser. No. 831,682.

TECHNICAL FIELD OF THE INVENTION

The present invention relates in general to sense amplifier circuits and sensing techniques, and more particularly to sense amplifiers of the type for sensing memory readouts and providing corresponding digital output signals.

BACKGROUND OF THE INVENTION

Many types of semiconductor and other types of memories store very small electrical charges that correspond to either a digital one or digital zero state. When a memory cell storing such a small charge is read, a small voltage of about 50-200 millivolts is developed on a bit line, which voltage must then be translated by a sense amplifier into a corresponding digital state. The sense amplifier must discriminate between either a small bit line voltage representative of a zero state or a somewhat larger bit line voltage representative of a one state and thereby produce an output digital state.

Sense amplifier design is a highly developed field for optimizing the translation of memory readout signals into corresponding digital signals in a highly reliable manner. Design considerations include speed, circuit area, noise immunity for discriminating between memory circuit noise and readout signals, as well as power considerations so that a memory that incorporates a large number of sense amplifiers does not consume substantial power. Circuit considerations as well as semiconductor fabricating techniques must be addressed so that the electrical characteristics of all the sense amplifiers in a memory are substantially identical and do not change due to various external parameters, including temperature.

One type of sense amplifier commonly used with dynamic random access memories and ferroelectric memories is the flip-flop type of latch that can discriminate between a reference voltage and a bit line voltage of either a zero or one level. In this configuration, a bit line is connected to one node of the sense amplifier flip-flop, while a reference voltage is connected to the other node. The flip-flop is of the type that can be switchably connected to a supply voltage so that after the readout signal appears on the bit line, the flip-flop is powered up, whereupon the flip-flop assumes a state based upon magnitude of the memory readout voltage. In other words, if the readout voltage is less than the reference, the flip-flop will assume one digital state, whereas if the readout voltage is greater than the reference voltage, the flip-flop will assume an opposite state.

Other types of sense amplifiers include either single-ended or double-ended differential input amplifier stages, followed by other differential stages and inverter outputs. While single stage differential amplifiers have high gain characteristics, and require relatively little semiconductor area, the electrical offset characteristics often vary between different sense amplifiers, due to process variations and layout symmetry. In addition, small area single-stage differential amplifiers have a characteristic lower bandwidth, poor drive capability, and limited signal swing. Two-stage differential amplifiers generally include two parallel arranged single-stage differential amplifiers, and a third single-stage differential amplifier receiving the outputs of the first stage amplifiers. In this latter configuration, a higher bandwidth can be achieved, and higher signal swing and drive capability is available without loss in accuracy. Offset sensitivities of the two-stage differential amplifier configuration are generally reduced, and speed as well as power consumption is compromised, with the attendant increase in the area of semiconductor material required.

From the foregoing, it can be seen that a need exists for an improved sense amplifier of the type that has a high signal sensitivity, lower power consumption, simplicity of operation, high speed, and includes relatively few components, thereby requiring little semiconductor area.

SUMMARY OF THE INVENTION

In accordance with the present invention, the disclosed sense amplifier, and method of operation thereof, substantially reduce or eliminate the disadvantages and shortcomings associated with the prior art circuits and techniques. According to one aspect of the invention, an uncomplicated single-stage differential amplifier is utilized to discriminate between a reference voltage and memory readout signals on a bit line. Offset voltage variations between the various differential input amplifiers of the sense amplifiers within a memory array are not of paramount importance, as subsequent stages are equalized prior to each memory readout operation. According to another feature of the invention, a low impedance amplifier stage, comprising a CMOS transistor pair, is connected to the differential amplifier output. The transistors of this stage are fabricated to operate at a quiescent output of about half the supply voltage, thereby providing a range of operation above and below such operating point to compensate for nonideal offsets in the input differential stage. The output of the low impedance inverter is capacitively coupled to a switched inverter. The switched inverter includes a transistor connected between the input and output thereof for placing the inverter at a high gain, trip point of about one-half the supply voltage. During an equalization time period which occurs prior to a memory read operation, the coupling capacitor is charged to a voltage defined by the difference between the switched inverter trip point and the low impedance inverter output which is about half the supply voltage. During a memory readout operation, the reference voltage and the bit line voltage are applied to the differential amplifier input stage, and depending upon whether the memory cell that was read stored a one or zero signal, the differential amplifier output will cause the low impedance inverter to provide an increased output voltage, or a decreased output voltage. The change in output voltage of the low impedance inverter causes a corresponding charge to be coupled to or from the coupling capacitor, thereby causing the switched inverter to move from its trip point to either a digital high state or a digital low state, depending upon the memory readout. A CMOS transistor pair can also be connected to the output of the switched inverter to thereby improve output speed and drive capability of the sense amplifier.

In accordance with another aspect of the invention, a switched reference voltage circuit can be utilized in conjunction with the switched sense amplifier, and both such circuits clocked together to provide a synchronized memory readout operation. In particular, the switched reference voltage generator is adapted for operation with a ferroelectric type of memory so that the reference voltage is dynamically generated during each memory read operation. The reference voltage is generated by a pair of ferroelectric capacitors, and thus the reference voltage dynamically tracks the changing characteristics of the ferroelectric capacitors of the memory cells themselves. In a memory read operation, the bit lines are precharged during the same time period that the switched inverter is equalized. Subsequently, an addressed memory cell is read, and simultaneously the reference voltage is generated, whereupon the differential amplifier presents a change in the charge of the sense amplifier coupling capacitor, which also upsets the trip point of the switched inverter and drives it to a digital state that corresponds to the memory readout.

In accordance with another feature of the invention, the sense amplifier of the invention has a characteristic high speed, and requires much less semiconductor area than the well known two-stage differential amplifier type of sense amplifier.

BRIEF DESCRIPTION OF THE DRAWINGS

Further features and advantages Will become apparent from the following and more particular description of the preferred embodiment of the invention, as illustrated in the accompanying drawings in which like reference characters generally refer to the same components or elements throughout the views, and in which:

FIG. 1 is a block diagram of the sense amplifier according to the invention;

FIG. 2 is a detailed electrical schematic drawing of the sense amplifier according to the invention, in conjunction with a dynamic reference voltage generator; and FIG. 3 illustrates various electrical waveforms for controlling the switched sense amplifier and the reference voltage generator.

DETAILED DESCRIPTION OF THE INVENTION

FIG. 1 illustrates an environment in which the invention can be advantageously practiced. Illustrated in block form are various circuits provided in a conventional semiconductor memory, including an address decoder 12 for decoding input addresses to select either one cell or a row of cells. The address decoder 12 is connected to the memory array 14 that embodies a number of memory cells defined by rows and columns. One memory bit line 16 associated with a column of the array is shown connected to the sense amplifier 1 of the invention. In order to differentiate a readout signal on the bit line 16 as to either a one or zero, a reference voltage generator 20 generates a reference voltage or signal, also input to the sense amplifier 18. It should be noted that while the sense amplifier 18 is illustrated as operating in conjunction with a single column bit line 16 and a reference voltage 20, the sense amplifier 18 can also be employed in connection with a memory array of the type having complementary bit lines, in which case no reference voltage is required. Also, while the sense amplifier 18 of the invention is described below in connection with a ferroelectric-type memory array, the sense amplifier 18 is not limited for use with such type of memory. Also the sense amplifier of the invention is not limited for use with a dynamic type of reference voltage, but can be utilized with conventionally generated reference voltages.

The sense amplifier 18 according to the invention provides a high speed determination of the state of the memory readout on the column bit line 16 and produces a corresponding digital output on the $D_{out}$ terminal 22. As can be appreciated, one sense amplifier is required for each column of the memory array 14, of which there may be many, for example 256. In addition, when fabricated with CMOS technology, the sense amplifier 18 requires few components and thus little semiconductor chip area.

In the preferred form of the invention, the sense amplifier 18 includes a single stage input differential amplifier 24, receiving on one input the bit line voltage and on another input the reference voltage. The differential amplifier 24 need not be of the sophisticated type with high precision where special precautions are made to minimize offset voltage differences between the various sense amplifiers of the memory chip. The output of the differential amplifier 24 is connected to a low input impedance inverting amplifier 26. The low impedance amplifier is constructed with a p-channel transistor and an n-channel transistor with channel dimensions such that the output thereof preferably remains at a quiescent voltage of about one-half the supply voltage. Hence, any departure of the offset voltage of the differential amplifier 24 results in a corresponding departure from the quiescent voltage output of the inverting amplifier 26. As will be described in more detail below, as long as the output of the inverting amplifier 26 lies somewhat in the operating range between the supply voltage and ground (or Vcc and Vss), the overall operation of the sense amplifier is not compromised. The output of the inverting amplifier 26 is AC-coupled by a capacitor 28 to a switched inverter 30. The switched inverter 30 includes a conventional CMOS inverter 32 with a shorting transistor 34 connected thereacross. The transistor switch 34 is driven by an equalization signal during a sense amplifier equalization time period. The output of the switched inverter 30 is connected to an output inverter 36 having a $D_{out}$ terminal 22 providing a digital output representative of the memory readout.

The operation of the sense amplifier 18 involves at least two time periods, namely, an equalization time period and a sensing time period, both of which can be carried out in a very short period of time. During the equalization time period, the column bit line 16 and the reference signal on line 90 are precharged to a predetermined voltage, such as 0 volts. During this time period, an equalization signal is applied to the switching transistor 34 for short circuiting the output of the switched inverter 32 to its input. The switched inverter 32 is thus caused to operate at a point on its transfer function that represents maximum gain and highest bandwidth in the linear region of the inverter. At this point, the input and output voltage of the inverter are about equal and preferably about one-half the supply voltage. At this operational point of equilibrium, and when the inverter 32 is no longer short circuited, any slight increase in the input voltage will cause the inverter 32 output to abruptly drop to zero volts, whereas a slight decrease in the voltage input to the inverter 32 will cause its output to abruptly transcend to the supply voltage. During the equalization time period, the coupling capacitor 28 is charged to a voltage defined by the difference between the output of the low impedance amplifier 26 and the equilibrium voltage of the switched inverter 30. During the equalization time period, the signal output by the sense amplifier output inverter 36 on the $D_{out}$ terminal 22 is irrelevant. As will be described in more detail below, the equalization signal is applied to a dynamic reference voltage generator for preconditioning purposes.

Subsequent to the equalization time period is the sensing time period in which the addressed memory cell is read and the resultant signal appears on the column bit line 16. During this latter time period, the equalization signal is removed from the sense amplifier 18, and the switched inverter 30 is ready to respond to any change in voltage coupled to it through the coupling capacitor 28.

The reference voltage 20 may be of the static type which provides a continuous reference voltage to the sense amplifier 18. However, in the preferred form of the invention, and to be described more thoroughly below, the reference voltage 20 is of the dynamic type that is generated during the sensing time period. Thus, during the sensing time period the differential amplifier 24 is provided with a readout signal from the bit line 16 on one input, and a reference voltage on the other input. As noted above, depending upon whether the bit line signal has an amplitude that is greater than or less than the reference voltage, the output of the differential amplifier 24 will either be high or low. The output of the differential amplifier 24 is input to the low impedance amplifier 26 which upsets the quiescent voltage on the output thereof. The departure of the quiescent output voltage of the low impedance amplifier 26 causes a change in electrical charge to be transferred via the coupling capacitor 28 to the input of the switched inverter 32. If charge is transferred to the input of the switched inverter 32, the output thereof will transcend to a low state. On the other hand, if charge is transferred from the input of the switched inverter 32, the output thereof will transcend to the supply voltage. The output inverter 36 will invert the signal and provide the corresponding digital state to the $D_{out}$ terminal 22. Depending upon the fabrication technique for forming the sense amplifier 18 in a semiconductor material, the entire sensing time period can take place anywhere from about 1.3 nanoseconds for a 50 millivolt input difference, to about 10 nanoseconds for a 2 millivolt differential input. As can be appreciated, the sense amplifier 18 has extremely high speed resolution of the memory readout signal.

FIG. 2 shows the sense amplifier 18 in more detail, as well as the reference voltage generator 20 and a portion of the memory array 14. The memory array 14 is shown as a two-by-two array of memory cells, one cell shown as numeral 40. The memory cell 40 includes a ferroelectric capacitor 42 connected in series with a select transistor 44 between a column bit line 16 and a drive line 46 that is common to other cells on the array. While only one bit line 16 is shown connected to a sense amplifier 18, it should be noted that the remaining column bit lines of the array 14 are each connected to similar sense amplifiers. For each horizontal row of the memory array 14 there is a corresponding word line WL.

In accordance with a preferred form of the invention, a complementary bit line type of reference column 50 is provided, each row thereof being driven by a word line associated with the row of cells in the memory array 14. The reference column 50 provides an output reference voltage each time the memory array 14 is accessed. Accordingly, each time a word line is addressed, the corresponding row of cells in the memory array 14 are read, as well as the complementary cell in the reference column 50. It is to be noted that the ferroelectric capacitors of the reference column 50 are driven by the same drive line 46 as the memory array 14. It is also to be noted that when the memory cell 40 of array 14 is accessed by word line $WL_n$, the complementary reference cell 52 is also accessed. The complementary reference cell 52 includes ferroelectric capacitor 54 and select transistor 56 connected in series between a reference bit line 58 and the drive line 46. In a similar manner, ferroelectric capacitor 60 is connected in series with a select transistor 62 between a reference complementary bit line 64 and the drive line 46. During a memory read cycle, the ferroelectric capacitors of both the memory array 14 and the reference column 50 are destructively read, and therefore need to be rewritten to the original state. A CMOS pass gate comprising a p-channel transistor 66 and an n-channel transistor 68 are connected between the reference complementary bit lines 58 and 64. The bit lines 58 and 64 are connected through respective capacitors 70 and 72 to circuit ground. A sense/write (S/W) signal is applied to the pass gate p-channel transistor 66, and through an inverter 74 to the gate of the n-channel transistor 68. An equalization signal is applied to transistors 76 and 78 for precharging the complementary bit lines 58 and 64 to zero volts during a equalization time period. A transistor 79 also precharges the bit line 16 to zero volts in response to the equalization signal. During a rewrite time period in which the ferroelectric capacitors of the reference column 50 are polarized to original opposite states, the S/W signal is applied to transistor 80 for grounding complementary bit line 64, and is applied through the inverter 74 to p-channel transistor 82 for coupling the supply voltage to the bit line 58. The complementary bit lines 58 and 64 are thereby precharged to opposite states.

The various stages of the sense amplifier 18 are also shown in detail in FIG. 2. The reference voltage carried on conductor 90 and the memory readout signal carried on the bit line 16 are both coupled to respective inputs of the differential amplifier 24. The differential amplifier 24 includes a p-channel transistor 92 and an n-channel transistor 94 connected in series between circuit ground and a switched supply voltage node 96. The gate of the transistor 94 is connected to its drain. The gate of transistor 92 defines a first differential input and is connected to the bit line 16. A second p-channel transistor 98 and n-channel transistor 100 are connected in series between circuit ground and the switched supply voltage node 96. The gates of transistors 94 and 100 are connected in common, while the gate of the transistor 98 defines the other differential input connected to the reference voltage line 90. The junction between the source of transistor 98 and the drain of transistor 100 define a node 101 comprising an output of the differential amplifier 24. A p-channel transistor 102 is connected between the supply voltage and the switched supply voltage node 96 to control the application of power to the differential amplifier. The transistor 102 is controlled by a signal $V_{sink}$. The differential amplifier transistors are selected for minimal semiconductor area, rather than maximum offset performance.

The output node 101 of the differential amplifier 24 is connected to the low impedance amplifier 26, which comprises a CMOS pair defined by a p-channel transistor 110 connected in series with an n-channel transistor 112. The p-channel transistor 110 has a gate thereof controlled by the $V_{sink}$ signal. The common node 114 between the transistors 110 and 112 define an output of the amplifier 26 connected to the coupling capacitor 28. By controlling the application of the supply voltage to the differential amplifier 24 and the low impedance amplifier 26, power can be conserved during periods of nonuse of the sense amplifier, such as during the equalization period, as well as other time periods. Importantly, the channel width/length of transistors 110 and 112 are selected such that the quiescent voltage at the output node 114 is about midway between the supply voltage and ground. In the preferred form of the invention, the p-channel transistor 110 has a width/length ratio of about 3.4/2.2, while the ratio of the channel of the n-channel transistor 112 is about 2/1. With this transistor construction, as well as the quiescent voltage output by the differential amplifier 24, the node 114 of the low impedance amplifier 26 is about 2.5 volts, when the supply voltage is 5.0 volts. While it is preferable that the voltage of the output node 114 be midway between the supply voltage and ground, acceptable operation of the sense amplifier 18 can be realized with a quiescent output voltage in the range of greater than about 0.5 volts above ground and less than about 0.5 volts below the supply voltage. As can be appreciated, a significant variation in the structure and operation of the differential amplifier 24 can be tolerated while yet maintaining the output of the low impedance amplifier 26 within its quiescent operating range.

The coupling capacitor 28 is shunted by a switching transistor 120 when driven into conduction by an off/on signal applied to the gate thereof. The coupling capacitor 28 provides AC coupling between the low impedance amplifier 26 and the switched inverter 30. The switched inverter 30 includes a CMOS transistor pair, defined by p-channel transistor 122 and n-channel transistor 124 connected between the supply voltage and ground. The gates of transistors 122 and 124 are connected in common to one terminal of the coupling capacitor 28. A transistor 126 is connected between the gates of the switched inverter transistors 122 and 124 and ground. The off/on signal is applied to the gate of transistor 126 to discharge the gates of the switched inverter transistor pair 122 and 124 to thereby assure that the transistor 124 is maintained in a nonconductive state during nonuse periods of the sense amplifier 1. A shorting transistor 128 has source and drain terminals connected between the input and output of the switched inverter 30 for providing a short circuit connection. The shorting transistor 128 is driven by the same equalization signal (Eq) as the reference voltage generator 20. The threshold voltages of transistors 122 and 124 are selected such that when the switching transistor 128 is fully conductive, a high gain, equilibrium point is reached, whereby both transistors are on the verge of being saturated. Preferably, the equilibrium point is about one-half the supply voltage.

The output sense amplifier stage 36 also comprises a CMOS transistor pair, defined by p-channel transistor 130 connected in series with an n-channel transistor 132 between the supply voltage and ground. The gates of transistors 130 and 132 are connected in common to the output of the preceding switched inverter stage 30. Preferably, the PMOS transistors 122 and 130 are fabricated substantially identical, as are the n-channel transistors 124 and 132. Accordingly, when the switched inverter 30 is short circuited and at its state of equilibrium, the output stage 36 will also be at or near its equilibrium, with an output of close to one-half the supply voltage. In other words, with the transistors of stages 30 and 36 fabricated substantially identical, the trip points of equilibrium will also be similar. At the trip point, the gain of the output 36 will be substantially high, thereby assuring high speed operation.

FIG. 3 illustrates the electrical waveforms for driving the memory 10 during a read operation thereof. The $V_{sink}$ signal 140 occurs coincident in time with the off-/on signal 140, but goes from a normal level of about three and one-half volts to a high supply voltage. As noted above, the $V_{sink}$ signal 140 assures that the differential amplifier 24 and the low impedance amplifier 26 are momentarily disconnected from the supply voltage. Both signals 140 and 142 have a width of about 10 nanoseconds.

The sense amplifier equalization signal 144 occurs subsequent to the off/on signal 142 and the $V_{sink}$ signal 140, and is shown to have a width of about 40 nanoseconds. The equalization signal 144 short circuits the input and output of the switched inverter 30 to place it in a high gain, unstable condition, at its trip point.

Waveforms 146 and 148, respectively, illustrate the application of the dynamic reference voltage 146 and the bit line voltage 148. The $V_{ref}$ signal 146 is shown to be about 50 millivolts greater in amplitude than the bit line voltage 148.

Electrical waveform 140 is the off/on signal that is driven high during the initial portion of a read cycle to precondition the switched inverter 30.

The next set of electrical waveforms depict in solid line the voltage at node 101, namely the output of the differential amplifier 24. The waveform illustrated by the long broken lines illustrates the electrical response at node 114, namely the output of the low impedance amplifier 126. The short broken line indicates the voltage input to the switched inverter 30, namely node 121.

The last set of electrical waveforms illustrates respectively, in broken line, and in solid line, the input and output voltage of the output inverter 36.

A read operation of the memory device is carried out in the following manner. Prior to a read operation, or during an initial time period thereof, the equalization signal 144 is applied to the reference voltage generator 20 as well as the sense amplifier 18. Concurrent with the application of the off/on signal 142, the $V_{sink}$ signal 140 is also applied. The off/on signal 142 drives transistor 120 and transistor 126 into conduction to discharge the coupling capacitor 28 to zero volts as well as precharge the input to the switched inverter 30 to zero volts. The $V_{sink}$ signal 140 momentarily drives transistors 102 and 110 into conduction to precharge nodes 96 and 114 to a supply voltage magnitude, less the threshold voltage of such transistors. As noted also, since the reference voltage on line 90 and the bit line 16 are both at a low voltage level, p-channel transistors 92 and 98 are also driven into conduction. With the gate of n-channel transistor 100 connected to the drain of p-channel transistor 92, both transistors 94 and 100 will also be driven into conduction. Hence, the output node 101 of the differential amplifier 24 attempts to be driven high by transistors 102 and 98, but is also pulled low by transistor 100. Thus, as noted in the waveforms, node 101 remains about one threshold voltage above ground, namely, about one volt. During the time period of the off/on signal 142, the input node 121 of the switched inverter 30 is driven to one threshold above ground by transistor 126. Because transistors 110, 120 and 126 are all driven into conduction, the voltage at node 114 is about two thresholds above ground, due to the threshold voltages of transistors 120 and 126. Such voltages are noted in FIG. 3. Because the Voltage at node 123 is low with respect to p-channel transistor 130, it is driven into conduction, thereby providing a high output voltage at node 123.

The equalization time period starts on the rising edge of the equalization signal 144. During this time period, the off/on signal 142 has returned to a low level, while the $V_{sink}$ signal 140 has returned its normally high level. The equalization signal 144 drives transistors 76 and 78 of the reference voltage generator 20 into conduction, thereby driving the reference complementary bit lines 58 and 64 to a low level. Further, the equalization signal 144 drives transistor 128 into conduction, thereby placing a short circuit between input node 121 and the output node 123 of the switched inverter 30. As noted above, this places the switched inverter 30 into its high gain trip point. As noted in the electrical waveforms, the voltage at node 121 rises and the voltage at node 123 decreases to a point of equilibrium. The voltage at the switched inverter output node 123 at this time is about 2.5 volts, i.e, one-half the supply voltage, while the voltage at node 114 discharges slightly, due to the conductive state of transistor 112. During the falling transition of the equalization signal 144, the gate capacitance of transistor 128 causes a charge transfer such that the voltage at node 123 rises somewhat, such that the $D_{out}$ signal is driven low. While the glitch at node 123 and the corresponding response at the $D_{out}$ terminal is not desirable, the adverse effects are not significant as the data out terminal changes to the proper state, based upon the signal's input to the differential amplifier 24. Those skilled in the art may find it advantageous to provide a dummy transistor, with its drain and source shorted together to offset the adverse effects of the gate capacitance of transistor 128 during the falling transition of the equalization signal 144. The removal of the glitch is described in more detail in U.S. Pat. Nos. 3,983,414 and 4,075,509, the disclosures of which are incorporated herein by reference.

After equalization of the sense amplifier 18 and the reference voltage generator 20, the memory array 44 is accessed, as is the reference column 50. The arrays 44 and 50 are accessed by decoding the memory address and driving one of the word lines ($WL_n$) to a high level, thereby driving transistor 44, as well as the other transistors in the memory array 14 into conduction. Similarly, reference column transistors 56 and 62 are also driven into conduction. After the word line signal is established, the drive line 46 is also driven with a high voltage, which drive line voltage is applied to the ferroelectric capacitors 42 of the accessed memory array row, as well as to the reference column ferroelectric capacitors 54 and 60. Depending upon which state the ferroelectric capacitors of the memory array 14 are polarized, a corresponding signal will be developed on the bit line 16. Because the reference ferroelectric capacitors 54 and 60 are polarized in opposite directions, different charges will be transferred to the respective complementary bit lines 58 and 64. However, during the memory read cycle, the sense/write signal (S/W) is low, whereupon the inverter 74 drives transistor 68 into conduction. In like manner, the logic low level of the S/W signal drives the p-channel transistor 66 into conduction, thereby short circuiting the reference bit lines 58 and 64 together. This short circuiting action effectively provides a signal averaging function between the voltage on the complementary bit lines 58 and 64. The average voltage of the readout signals of the oppositely-polarized capacitors 54 and 60 of the reference array 50 is provided as a dynamic reference voltage on the $V_{ref}$ line 90. The bit line signal from the memory array on bit line 16 is applied to one input of the differential amplifier 24, while the reference voltage on the $V_{ref}$ line 90 is applied to the other input of the differential amplifier 24. As noted in the waveforms of FIG. 3, the reference voltage 146 is illustrated as being greater in magnitude than the readout signal 148 on the memory array bit line 16. As can be appreciated, had the ferroelectric capacitor 42 in the accessed cell of the memory array 14 been polarized in an opposite direction, the readout signal on the bit line 16 would have been greater than the reference voltage 146 on the $V_{ref}$ line 90. The reference voltage on line 90 is dynamically generated each time a memory read operation is carried out such that the magnitude of the reference voltage is a function of the instant characteristics of the ferroelectric capacitors of both the memory array 14 and the reference column 50, taking into consideration temperature, aging, fatigue, etc of the memory.

The application of the readout signal on the memory array bit line 16 and the reference voltage on line 90 to the differential amplifier 24 causes the trip point of the switched inverter 30 to be changed one way or the other, depending upon whether the memory array readout signal is greater than or less than the reference voltage. In general, the differential between the voltages input to the differential amplifier 24 operates through the low impedance amplifier 26 to cause the charge to be coupled through the capacitor 28 for changing the input of the switched amplifier and thereby drive the output thereof to a logic high or low voltage. In the example, the reference voltage 146 has a magnitude greater than the memory readout on the bit line 16, which difference causes the output node 101 of the differential amplifier 24 to be driven low. With such a signal at the gate of transistor 112, node 114 of the low impedance amplifier 26 rises toward the supply voltage level, since the p-channel transistor 110 remains in a conductive state because of the $V_{sink}$ voltage. The rising voltage at node 114 causes a transfer of charge through the coupling capacitor 28 to the input of the switched inverter 30. The additional charge coupled to the input of the switched inverter 30 charges the parasitic capacitances thereof, thereby increasing the voltage at the gates of transistors 122 and 124. With a voltage raised beyond the trip point, transistor 124 is driven into conduction, while transistor 122 is driven into cut-off. This action lowers the voltage at the output of the switched inverter (node 123), as illustrated in the waveforms of FIG. 3. The voltage at node 121 is also shown. While the voltage at node 123 is not at a logic low level, it is sufficient to drive the p-channel transistor 130 of the output inverter 36 into conduction and provide a logic high signal on the $D_{out}$ terminal 22.

While the waveforms of FIG. 3 are not shown to scale, either as to voltage or time, it is to be noted that the time between the application of the differential voltages to the differential input stage 24 and an output appears at the $D_{out}$ terminal 22 is extremely short. As noted above, the extent of the difference between the differential voltages applied to the inputs of the differential amplifier 24 is inversely proportional to the speed at which a corresponding logic signal appears at the $D_{out}$ terminal. For input signals differing in the range of about 50 millivolts, the sense amplifier 18 will provide a reliable output signal in as few as 1-2 nanoseconds. With a very small input differential of several millivolts, the sense amplifier 18 can provide a corresponding digital output in as few as 10 nanoseconds.

From the foregoing description, those skilled in the art can appreciate that when the bit line voltage is greater than the reference voltage, the circuit operates to provide a digital low signal on the $D_{out}$ terminal 22. Subsequent to a readout operation, the control signal $V_{sink}$ returns to the supply voltage level to thereby turn off transistors 102 and 110, thereby preventing undesired power consumption of the sense amplifier. Further, the off/on signal 142 is returned to a logic high level to thereby drive transistors 120 and 126 into conduction. This latter action discharges circuit nodes 114 and 121 and turns off transistor 124.

In addition to the provision of a high speed sense amplifier, the circuit configuration of the sense amplifier 18 requires a small area of semiconductor material for fabrication therein. According to experimental evaluations, the sense amplifier 18 requires only about 1800 square microns of semiconductor area, while a conventional dual stage differential amplifier type of sense amplifier requires 4500 square microns of semiconductor area.

From the foregoing, an extremely high speed sense amplifier has been described. A technical advantage of the sense amplifier is that extra precautions need not be taken in the design and fabrication of the sense amplifier to achieve low offset characteristics. This is because the sense amplifier of the invention is calibrated prior to each memory read operation, whereby the adverse effects of offset characteristics due to circuit fabrication are taken into consideration during the calibration period when the sense amplifier is equalized. An additional technical advantage of the invention is the low power consumption of the sense amplifier during periods of nonuse. Yet another technical advantage of the invention is that it is ideally suited for use with a reference voltage generator that dynamically generates a reference voltage during each memory read operation. Yet another technical advantage of the sense amplifier is that by utilizing a low impedance amplifier having a broad operational range, the effects of the offset characteristics in the preceding differential amplifier stage are minimized. By utilizing the differential amplifier in conjunction with the low impedance amplifier, and a switched inverter that is calibrated to a trip point prior to a memory read operation, an extremely sensitive and high speed sense amplifier is achieved.

While the preferred embodiment of the invention has been disclosed with reference to a particular memory and sense amplifier structure, and operation thereof, it is to be understood that many changes in detail may be made as a matter of engineering choices without departing from the spirit and scope of the invention, as defined by the appended claims.

What is claimed is:

1. A sense amplifier for sensing a memory readout signal, comprising:
   a differential input stage for receiving a memory readout signal and a reference voltage and for providing an output signal representative of the memory readout signal;
   a switched inverter having an input and output short circuited during an equalization time period for biasing the switched inverter to a trip point;
   a capacitor for coupling an output signal generated by the differential input stage to the switched inverter; and
   a timing circuit for removing the short circuit between the switched inverter input and output and applying the output signal of the differential input stage to the capacitor, whereby the switched inverter provides a high speed digital signal representative of the memory readout signal.

2. The sense amplifier of claim 1, further including an amplifier for coupling an output of the differential input stage to the capacitor.

3. The sense amplifier of claim 2, wherein said amplifier is constructed to achieve a quiescent operating output voltage of about half a supply voltage applied thereto.

4. The sense amplifier of claim 1, further including an output inverter connected to an output of the switched inverter.

5. The sense amplifier of claim 4, wherein said switched inverter and said output inverter each include a substantially identical PMOS transistor and a substantially identical NMOS transistor.

6. The sense amplifier of claim 1, further including means for switchably disconnecting said differential input stage from a source of supply voltage to conserve power during periods of nonsensing.

7. The sense amplifier of claim 1, further including means for placing the switched inverter in a low power state during periods of nonuse.

8. The sense amplifier of claim 1, further including in combination a complementary bit line memory, wherein one bit line is connected to one input of the differential input stage, and a complementary bit line is connected to another input of the differential input stage.

9. The sense amplifier of claim 1, further including a reference voltage circuit connected to one input of said differential input stage, said reference voltage circuit being switchable from one voltage to another voltage that is substantially intermediate a memory readout voltage indicating a zero readout and a memory readout voltage indicating a one readout.

10. The sense amplifier of claim 9, wherein said zero and one readout memory voltages correspond to readout voltages of ferroelectric capacitors polarized in opposite states.

11. A memory circuit for sensing a memory readout, comprising in combination:
    a reference voltage generator responsive to memory read signals for generating an output reference voltage;
    a sense amplifier having
       an input stage responsive to a difference between a memory readout signal and the reference voltage for providing an output;
       a switched inverter biased to a trip point;
       a coupling capacitor for coupling the output of the sense amplifier input stage to the switched inverter; and
    a timing circuit for timing operation of the reference voltage generator with the operation of the sense amplifier.

12. The memory circuit of claim 11, further including a low impedance inverter for coupling the output of the input stage to the coupling capacitor, said low impedance inverter providing a quiescent voltage intermediate the supply voltage and a circuit ground.

13. The memory circuit of claim 11, further including means for generating an equalization signal for equalizing said switched inverter by shot circuiting an input to an output of the switched inverter, said equalization signal being effective to cause precharging of a bit line associated with said reference voltage generator.

14. The memory circuit of claim 11, wherein said reference voltage generator is driven by a signal for generating a reference voltage during a time coincident with said memory readout, and said reference voltage is at a different voltage at other times.

15. A method for sensing a memory readout and providing a corresponding digital signal, comprising the steps of:

during an equalization time period,
   a) applying a signal to an inverter to force the inverter to a trip point voltage,
   b) providing a steady-state signal by an input sense amplifier stage,
   c) charging a coupling capacitor to a voltage defined by the difference between the trip point voltage and the steady-state signal; and during a sensing time period,
   a) removing the signal applied to the inverter; and
   b) increasing the steady-state voltage if the readout of the memory is of one type, and decreasing the steady state voltage if the readout of the memory is of another type to thereby charge or discharge the coupling capacitor and drive the trip point of the output of the inverter to one digital state or another digital state.

16. The method of claim 15, further including providing said steady state signal of about one-half the supply voltage during the equalization time period.

17. The method of claim 15, further including coupling a reference voltage to one input of a differential input stage and coupling a memory readout signal to another input thereof, and coupling a representation of the differential stage output to said coupling capacitor to charge or discharge said capacitor during the sensing time period.

* * * * *